(12) United States Patent
Yamada

(10) Patent No.: US 9,413,168 B2
(45) Date of Patent: Aug. 9, 2016

(54) ESD PROTECTION DEVICE

(71) Applicant: Murata Manufacturing Co., Ltd., Kyoto (JP)

(72) Inventor: Kosuke Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 140 days.

(21) Appl. No.: 14/546,212

(22) Filed: Nov. 18, 2014

(65) Prior Publication Data

US 2015/0070805 A1    Mar. 12, 2015

Related U.S. Application Data

(63) Continuation of application No. PCT/JP2013/065585, filed on Jun. 5, 2013.

(30) Foreign Application Priority Data

Jun. 15, 2012 (JP) .................. 2012-136136

(51) Int. Cl.
*H02H 7/20* (2006.01)
*H02H 9/04* (2006.01)
(Continued)

(52) U.S. Cl.
CPC .............. *H02H 9/044* (2013.01); *H01T 4/12* (2013.01); *H01T 4/16* (2013.01); *H05K 1/026* (2013.01); *H05K 1/0259* (2013.01); *H05K 2201/0209* (2013.01); *H05K 2201/0224* (2013.01); *H05K 2201/09063* (2013.01)

(58) Field of Classification Search
CPC ............. H02H 9/044; H01T 4/16; H01T 4/12

USPC ......................................... 361/112
See application file for complete search history.

(56) References Cited

U.S. PATENT DOCUMENTS

2011/0038088 A1* 2/2011 Noma ................. H01T 4/08
361/112

FOREIGN PATENT DOCUMENTS

JP    61-184292 U    11/1986
JP    03-276536 A    12/1991
(Continued)

OTHER PUBLICATIONS

Office Action issued in Japanese Patent Application No. 2014-521282 dated Dec. 24, 2014.
(Continued)

*Primary Examiner* — Thienvu Tran
*Assistant Examiner* — Tien Mai
(74) *Attorney, Agent, or Firm* — Pearne & Gordon LLP

(57) ABSTRACT

An ESD protection device 1 includes a plurality of input electrodes 21a through 21d and a plurality of output electrodes 21e through 21h. The plurality of input electrodes 21a through 21d are disposed along a first direction. The plurality of output electrodes 21e through 21h are disposed along the first direction. The plurality of output electrodes 21e through 21h oppose the input electrodes 21a through 21d in a second direction which is tilted with respect to the first direction. End portions of the input electrodes 21a through 21d on a side closer to the output electrodes 21e through 21h in the second direction and end portions of the output electrodes 21e through 21h on a side closer to the input electrodes 21a through 21d in the second direction form main discharge units 31a through 31d.

20 Claims, 7 Drawing Sheets

(51) Int. Cl.
  *H01T 4/12*   (2006.01)
  *H01T 4/16*   (2006.01)
  *H05K 1/02*   (2006.01)

(56) References Cited

FOREIGN PATENT DOCUMENTS

| JP | 2001-143846 A | 5/2001 |
| JP | 2005-276513 A | 10/2005 |
| JP | 2010-092779 A | 4/2010 |

OTHER PUBLICATIONS

International Search Report issued in Application No. PCT/JP2013/065585 dated Aug. 27, 2013.

Written Opinion issued in Application No. PCT/JP2013/065585 dated Aug. 27, 2013.

* cited by examiner

ESD PROTECTION DEVICE

BACKGROUND OF THE INVENTION

1. Field of the Invention

The present invention relates to an ESD protection device.

2. Description of the Related Art

Hitherto, various electro-static discharge (ESD) protection devices for suppressing the breakdown of electronic devices caused by ESD have been proposed. For example, Patent Document 1 discloses an ESD protection device in which a plurality of inner electrode pairs forming discharge units are disposed.

Patent Document 1: Japanese Unexamined Patent Application Publication No. 2001-143846

BRIEF SUMMARY OF THE INVENTION

In an ESD protection device, if discharge occurs, the temperature of a discharge unit increases. Accordingly, upon the occurrence of discharge, opposing portions of inner electrodes may melt or cracks may occur near an auxiliary discharge electrode, which may increase the distance between opposing inner electrodes or between conductive particles. Because of this, discharge may not occur properly between inner electrodes or between conductive particles. For example, if the distance between at least one pair of inner electrodes among a plurality of inner electrode pairs or between conductive particles is increased, this inner electrode pair does not function as ESD elements.

A principal object of the present invention is to improve the reliability of an ESD protection device including a plurality of discharge units.

An ESD protection device according to the present invention includes a plurality of input electrodes and a plurality of output electrodes. The plurality of input electrodes are disposed along a first direction. The plurality of output electrodes are disposed along the first direction and oppose the input electrodes in a second direction which is tilted with respect to the first direction. End portions of the input electrodes on a side closer to the output electrodes in the second direction and end portions of the output electrodes on a side closer to the input electrodes in the second direction form main discharge units. The plurality of input electrodes include two input electrodes which are disposed adjacent to each other in the first direction and which form a secondary discharge unit.

In a specific aspect of the ESD protection device according to the present invention, at least one of the two input electrodes may include a projecting portion which projects toward the other input electrode and which forms the secondary discharge unit.

In another specific aspect of the ESD protection device according to the present invention, the ESD protection device may further include an auxiliary discharge electrode. The auxiliary discharge electrode may be an electrode that is disposed between the two input electrodes so as to reduce a discharge start voltage across the two input electrodes. The auxiliary discharge electrode may form the secondary discharge unit.

In still another specific aspect of the ESD protection device according to the present invention, a discharge start voltage of the secondary discharge unit may be higher than a discharge start voltage of the main discharge units.

In yet another specific aspect of the ESD protection device according to the present invention, the plurality of input electrodes may include a plurality of pairs of the two input electrodes which form the secondary discharge unit. The plurality of secondary discharge units may include secondary discharge units displaced from each other in the second direction.

In yet another specific aspect of the ESD protection device according to the present invention, the plurality of main discharge units may include main discharge units displaced from each other in the second direction.

In yet another specific aspect of the ESD protection device according to the present invention, the input electrodes may have a plurality of electrode layers including a first electrode layer that opposes the output electrodes. The secondary discharge unit may be included in an electrode layer other than the first electrode layer.

In yet another specific aspect of the ESD protection device according to the present invention, the plurality of output electrodes may be electrically connected to each other.

In yet another specific aspect of the ESD protection device according to the present invention, the ESD protection device may further include a device body. The device body may contain the plurality of input electrodes and the plurality of output electrodes and may be made of an insulating material.

In yet another specific aspect of the ESD protection device according to the present invention, the device body includes a cavity. At least one of the main discharge units and the secondary discharge unit may be disposed within the cavity.

In yet another specific aspect of the ESD protection device according to the present invention, the ESD protection device may further include an outer electrode. The outer electrode may be disposed on the device body and may be connected to the input electrodes or the output electrodes.

Advantageous Effects of Invention

According to the present invention, it is possible to improve the reliability of an ESD protection device including a plurality of discharge units.

DETAILED DESCRIPTION OF THE INVENTION

Figure 1:
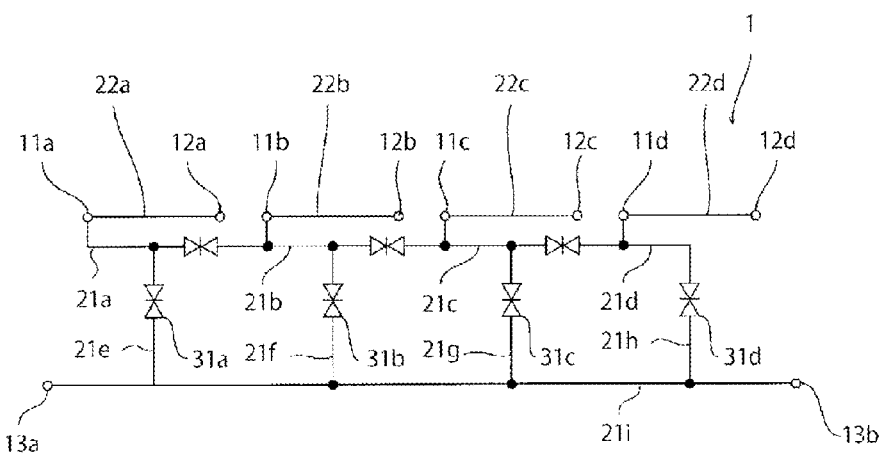
FIG. 1 is a schematic circuit diagram illustrating an ESD protection device according to a first embodiment.

Preferred embodiments of the present invention will be described below. However, the following embodiments are only examples and are not intended whatsoever to limit the present invention.

In the drawings referred to in the embodiments, components having substantially the same functions are designated by like reference numerals. Moreover, the drawings referred to in the embodiments are schematically depicted. The proportions of the dimensions of objects illustrated in the drawings may be different from those of the dimensions of actual objects. Additionally, the proportion of an object illustrated in one drawing may be different from that of the same object illustrated in another drawing. The specific dimensional proportions of the objects will be determined by considering the following description.

First Embodiment

Figure 2:
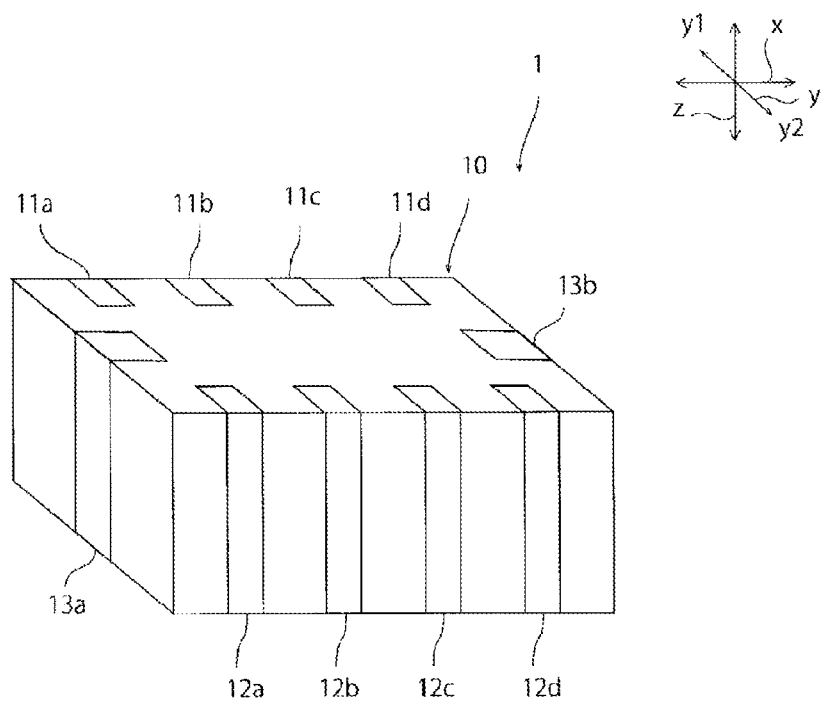
FIG. 2 is a schematic perspective view illustrating the ESD protection device according to the first embodiment.
Figure 3:
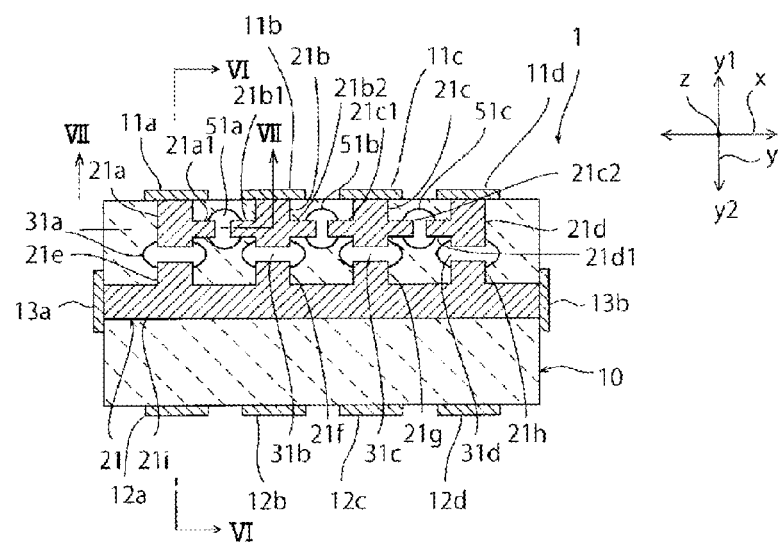
FIG. 3 is a schematic sectional view illustrating the ESD protection device according to the first embodiment.
Figure 4:
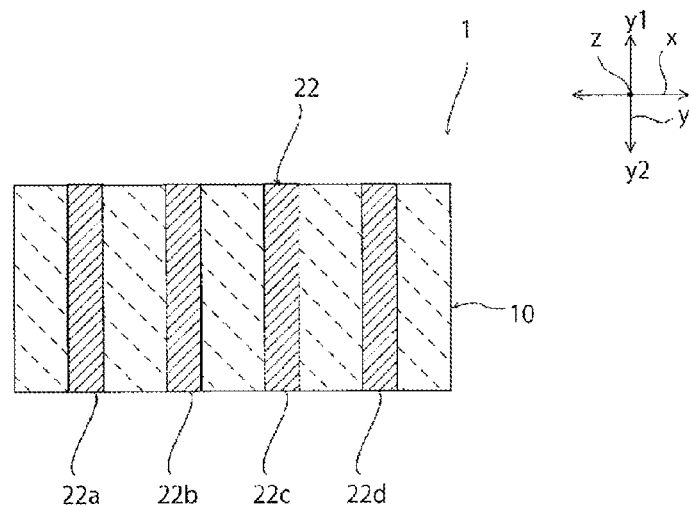
FIG. 4 is a schematic sectional view illustrating the ESD protection device according to the first embodiment.
Figure 5:
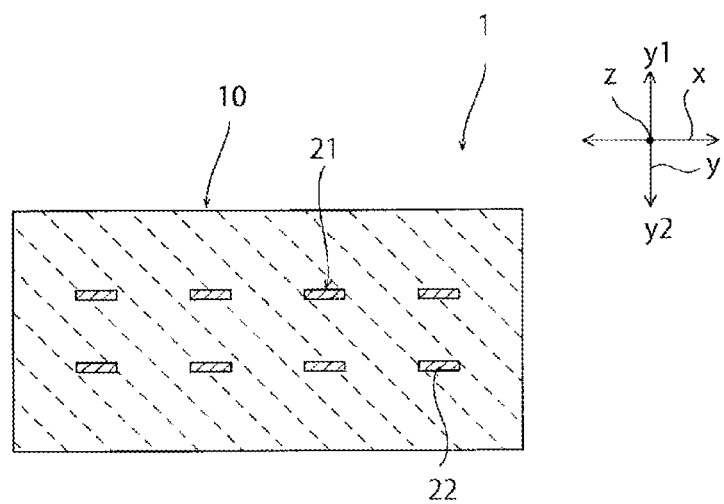
FIG. 5 is a schematic sectional view illustrating the ESD protection device according to the first embodiment.
Figure 6:
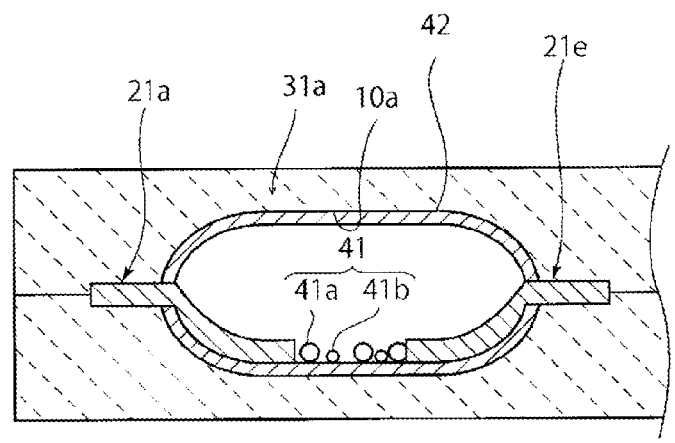
FIG. 6 is a schematic sectional view taken along line VI-VI of FIG. 3.
Figure 7:
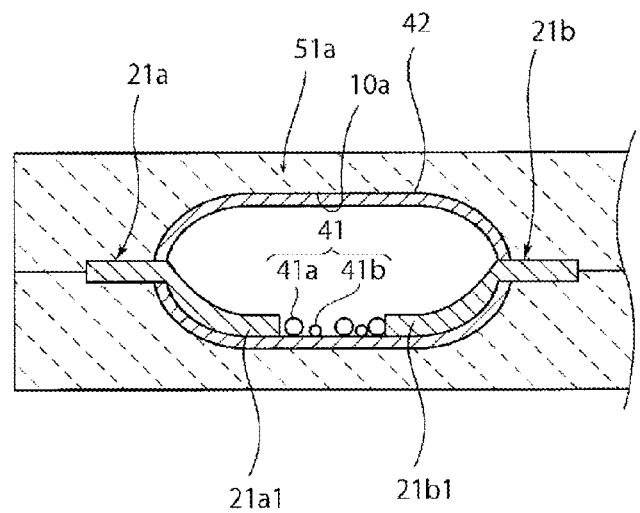
FIG. 7 is a schematic sectional view taken along line VII-VII of FIG. 3.

FIG. 1 is a schematic circuit diagram illustrating an ESD protection device according to a first embodiment. FIG. 2 is a schematic perspective view illustrating the ESD protection device according to the first embodiment. FIG. 3 is a schematic sectional view illustrating the ESD protection device according to the first embodiment. FIG. 4 is a schematic sectional view illustrating the ESD protection device according to the first embodiment. FIG. 5 is a schematic sectional view illustrating the ESD protection device according to the first embodiment. FIG. 6 is a schematic sectional view taken along line VI-VI of FIG. 3. FIG. 7 is a schematic sectional view taken along line VII-VII of FIG. 3.

An ESD protection device 1 shown in FIGS. 1 through 7 is a multi-terminal device in which a plurality of ESD elements are integrated with each other. That is, the ESD protection device 1 includes a plurality of pairs of input terminals and output terminals.

As shown in FIGS. 2 through 7, the ESD protection device 1 includes a device body 10. In this embodiment, the device body 10 is formed substantially in a rectangular parallelepiped shape. The device body 10 is made of an insulating material, for example, a suitable type of ceramic. More specifically, the device body 10 may be made of low temperature co-fired ceramics (LTCC) containing Ba, Al, and Si as principal elements.

On outer surfaces of the device body 10, input terminals 11a through 11d, output terminals 12a through 12d, and ground terminals 13a and 13b are disposed. As shown in FIGS. 3 through 6, first and second electrode layers 21 and 22 are disposed within the device body 10.

As shown in FIG. 1, the input terminal 11a and the output terminal 12a are electrically connected to each other by an electrode 22a included in the second electrode layer 22 shown in FIG. 4. The input terminal 11b and the output terminal 12b are electrically connected to each other by an electrode 22b included in the second electrode layer 22. The input terminal 11c and the output terminal 12c are electrically connected to each other by an electrode 22c included in the second electrode layer 22. The input terminal 11d and the output terminal 12d are electrically connected to each other by an electrode 22d included in the second electrode layer 22.

As shown in FIG. 1, the input terminal 11a is electrically connected to an input electrode 21a included in the first electrode layer 21 shown in FIG. 3. The input terminal 11b is electrically connected to an input electrode 21b included in the first electrode layer 21. The input terminal 11c is electrically connected to an input electrode 21c included in the first electrode layer 21. The input terminal 11d is electrically connected to an input electrode 21d included in the first electrode layer 21. The input electrodes 21a through 21d are disposed apart from each other along the x-axis direction.

The first electrode layer 21 also includes output electrodes 21e through 21h disposed along the x-axis direction and disposed in a direction farther toward a y2 side of the y-axis direction than the input electrodes 21a through 21d. The output electrode 21e opposes the input electrode 21a in the y-axis direction which is tilted (typically, perpendicular) with respect to the x-axis direction. An end portion of the input electrode 21a on the y2 side of the y-axis direction and an end portion of the output electrode 21e on a y1 side of the y-axis direction form a main discharge unit 31a. The output electrode 21f opposes the input electrode 21b in the y-axis direction which is tilted (typically, perpendicular) with respect to the x-axis direction. An end portion of the input electrode 21b on the y2 side of the y-axis direction and an end portion of the output electrode 21f on the y1 side of the y-axis direction form a main discharge unit 31b. An end portion of the input electrode 21c on the y2 side of the y-axis direction and an end portion of the output electrode 21g on the y1 side of the y-axis direction form a main discharge unit 31c. The output electrode 21g opposes the input electrode 21c in the y-axis direction which is tilted (typically, perpendicular) with respect to the x-axis direction. An end portion of the input electrode 21d on the y2 side of the y-axis direction and an end portion of the output electrode 21h on the y1 side of the y-axis direction form a main discharge unit 31d. The output electrode 21h opposes the input electrode 21d in the y-axis direction which is tilted (typically, perpendicular) with respect to the x-axis direction. The output electrodes 21e through 21h are electrically connected to an electrode 21i which is electrically connected to the ground terminals 13a and 13b. Accordingly, the output electrodes 21e through 21h are electrically connected to each other.

The electrodes discussed in this embodiment may be made of a suitable material, such as Cu or a Cu alloy.

Since the main discharge units 31a through 31d have substantially the same configuration, the specific configuration of the main discharge units 31a through 31d will be described below with reference to FIG. 6 which illustrates the main discharge unit 31a.

Opposing portions between the input electrodes 21a through 21d and the output electrodes 21e through 21h, respectively, are disposed within cavities 10a provided in the device body 10. That is, the end portions of the input electrodes 21a through 21d opposing the output electrodes 21e through 21h, respectively, and the end portions of the output electrodes 21e through 21h opposing the input electrodes 21a through 21d, respectively, are disposed within the cavities 10a. The configuration of the cavity 10a as viewed from above is not particularly restricted, and may be, for example, circular, elliptical, or oval. The configuration of the cavity 10a as viewed from the side is not particularly restricted, and may be, for example, circular, elliptical, or oval.

An auxiliary discharge electrode 41 is disposed between the end portions of each of the pair of the input electrode 21a and the output electrode 21e, the pair of the input electrode 21b and the output electrode 21f, the pair of the input electrode 21c and the output electrode 21g, and the input electrode 21d and the output electrode 21h. The auxiliary discharge electrode 41 has a function of reducing a discharge start voltage. More specifically, by the provision of the auxiliary discharge electrode 41, not only creeping discharge and air discharge, but also discharge via the auxiliary discharge electrode 41 occurs. Generally, the start voltage of discharge via the auxiliary discharge electrode 41 is lower than the start voltage of creeping discharge and that of air discharge. Accordingly, by the provision of the auxiliary discharge electrode 41, the discharge start voltage in the main discharge units can be reduced, thereby making it possible to suppress dielectric breakdown of the ESD protection device 1. Additionally, by the provision of the auxiliary discharge electrode 41, it is possible to improve the response characteristics of the ESD protection device 1.

The auxiliary discharge electrode 41 may be constituted by a particle dispersing element in which, for example, a plurality of metallic particles 41a coated with a non-conductive inorganic material and a plurality of semiconductor ceramic particles 41b, are dispersed. In this case, the auxiliary discharge electrode 41 may be formed by applying a paste including, for example, the plurality of metallic particles 41a coated with a non-conductive inorganic material and the plurality of semiconductor ceramic particles 41b, and by firing it.

The metallic particles 41a may be made of, for example, Cu or Ni. The diameter of each of the metallic particles 41a may be, for example, about 2 to 3 □m. A coating film on the metallic particles 41a may be made of, for example, aluminum oxide.

The semiconductor ceramic particles 41b may be made of, for example, a carbide, such as silicon carbide, titanium carbide, zirconium carbide, molybdenum carbide, or tungsten carbide, a nitride, such as titanium nitride, zirconium nitride, chromium nitride, vanadium nitride, or tantalum nitride, a silicide, such as titanium silicide, zirconium silicide, tungsten silicide, molybdenum silicide, or chromium silicide, a boride, such as titanium boride, zirconium boride, chromium boride, lanthanum boride, molybdenum boride, or tungsten boride, or an oxide, such as zinc oxide or strontium titanate.

The auxiliary discharge electrode 41 may also include insulating particles made of, for example, aluminum oxide, in addition to the metallic particles 41a and the semiconductor ceramic particles 41b.

The main discharge units 31a through 31d are each surrounded by a protective layer 42. By the provision of this protective layer 42, the diffusion of components contained in the device body 10 into the auxiliary discharge electrode 14 can be suppressed. It is thus possible to suppress a decrease in discharge characteristics caused by degradation of the auxiliary discharge electrode 14.

The protective layer 42 is preferably made of a ceramic having a higher sintering temperature than that of a ceramic forming the device body 10. The device body 10 preferably includes at least one compound selected from a group consisting of alumina, mullite, zirconia, magnesia, and quartz.

As shown in FIGS. 1 and 3, the plurality of input electrodes 21a through 21d are the input electrodes 21a through 21d which are disposed adjacent to each other in the x-axis direction and which include secondary discharge units. More specifically, a secondary discharge unit 51a is disposed between the input electrodes 21a and 21b adjacent to each other in the x-axis direction. A secondary discharge unit 51b is disposed between the input electrodes 21b and 21c adjacent to each other in the x-axis direction. A secondary discharge unit 51c is disposed between the input electrodes 21c and 21d adjacent to each other in the x-axis direction. As shown in FIG. 7, the secondary discharge units 51a through 51c have substantially the same configuration as that of the main discharge units 31a through 31d. Accordingly, a description of the main discharge units 31a through 31d will also be used for a description of the secondary discharge units 51a through 51c.

The secondary discharge unit 51a includes a projecting portion 21a1 projecting from the input electrode 21a toward the input electrode 21b and a projecting portion 21b1 projecting from the input electrode 21b toward the input electrode 21a. An auxiliary discharge electrode 41 is disposed between the projecting portions 21a1 and 21b1 so as to reduce the discharge start voltage.

The secondary discharge unit 51b includes a projecting portion 21b2 projecting from the input electrode 21b toward the input electrode 21c and a projecting portion 21c1 projecting from the input electrode 21c toward the input electrode 21b. An auxiliary discharge electrode 41 is disposed between the projecting portions 21b2 and 21c1 so as to reduce the discharge start voltage.

The secondary discharge unit 51c includes a projecting portion 21c2 projecting from the input electrode 21c toward the input electrode 21d and a projecting portion 21d1 projecting from the input electrode 21d toward the input electrode 21c. An auxiliary discharge electrode 41 is disposed between the projecting portions 21c2 and 21d1 so as to reduce the discharge start voltage.

The discharge units are portions where they preferentially discharge when a high voltage is applied. Among the discharge units, the main discharge units are portions where they preferentially discharge over the secondary discharge units when a high voltage is applied.

The discharge start voltage of the secondary discharge units 51a through 51c is preferably equal to or higher than that of the main discharge units 31a through 31d. More preferably, the discharge start voltage of the secondary discharge units 51a through 51c is 1.1 times or more as high as that of the main discharge units 31a through 31d, and even more preferably, the discharge start voltage of the secondary discharge units 51a through 51c is 1.2 times or more as high as that of the main discharge units 31a through 31d.

As described above, in the ESD protection device 1, not only the main discharge units 31a through 31d, but also the secondary discharge units 51a through 51c are disposed. It is now assumed that the discharge start voltage of the main discharge unit 31a has become excessively high because of, for example, the melting of the end portion of the input electrode or the output electrode due to the heat generation caused by discharge or because of the occurrence of cracks near the auxiliary discharge electrode. Even in this case, however, with the application of a high voltage to the input electrode 21a, the secondary discharge unit 51a, the input electrode 21b, the main discharge unit 31b, the output electrode 21f, the electrode 21i, and the ground terminals 13a and 13b discharge. Accordingly, as long as the discharge start voltage of at least one of the main discharge units 31a through 31d is maintained at a predetermined discharge start voltage or lower, discharge occurs properly. Thus, the ESD protection device 1 exhibits high reliability.

In this embodiment, an example in which a secondary discharge unit is disposed between each pair of adjacent input electrodes has been discussed. However, a secondary discharge unit may be disposed between at least one pair of adjacent input electrodes.

It is not always necessary that the secondary discharge unit have an auxiliary discharge electrode. It is also not always necessary that the secondary discharge unit include projecting portions provided in the input electrodes. For example, the secondary discharge unit may be formed by disposing an auxiliary discharge electrode between adjacent input electrodes which are not provided with projecting portions.

The ESD protection device may be, for example, two-terminal device or a three-terminal device, or may have five or more terminals.

Other preferred embodiments of the present invention will be described below. In the following description, components having substantially the same functions as those of the first embodiment are designated by like reference numerals, an explanation thereof will thus be omitted.

Second Embodiment

Figure 8:
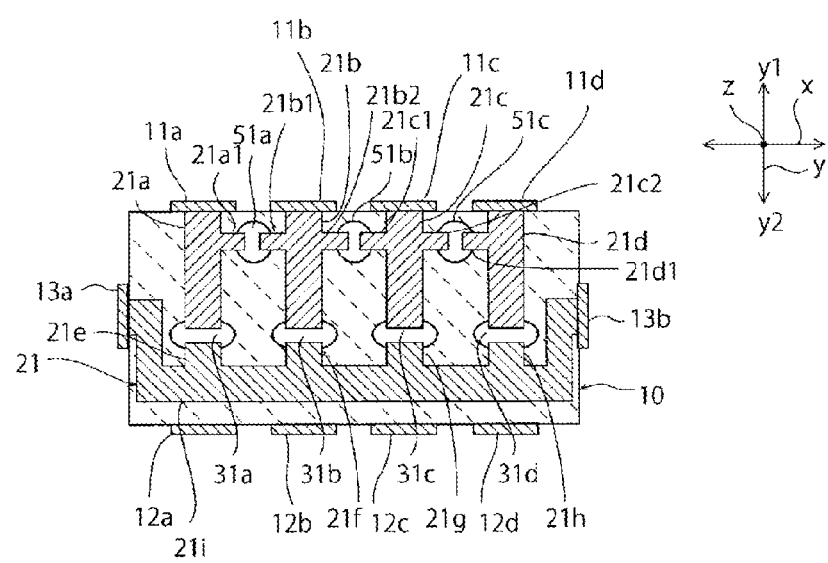
FIG. 8 is a schematic sectional view illustrating an ESD protection device according to a second embodiment.

FIG. 8 is a schematic sectional view illustrating an ESD protection device according to a second embodiment. In the ESD protection device shown in FIG. 8, the distances between the main discharge units 31a through 31d and the secondary discharge units 51a through 51c are long. Accordingly, for example, it is less likely that the heat generated in the main discharge units 31a through 31d will be conducted to the secondary discharge units 51a through 51c. Thus, the secondary discharge units 51a through 51c are less likely to deteriorate due to the heat generation caused by discharge in the main discharge units 31a through 31d.

Third Embodiment

Figure 9:
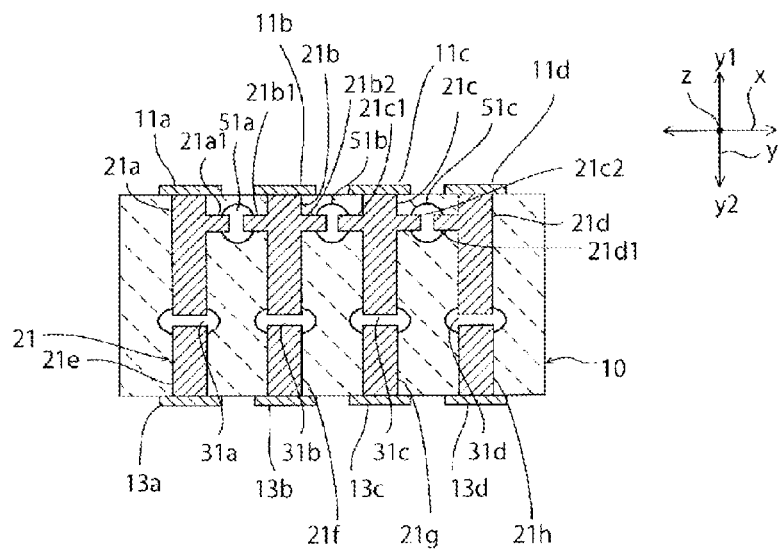
FIG. 9 is a schematic sectional view illustrating an ESD protection device according to a third embodiment.

FIG. 9 is a schematic sectional view illustrating an ESD protection device according to a third embodiment. A plurality of output electrodes 21e through 21h do not have to be electrically connected to each other, as in the ESD protection device shown in FIG. 9. In this embodiment, the output electrodes 21e through 21h are connected to ground terminals 13a through 13d, respectively.

Fourth Embodiment

Figure 10:
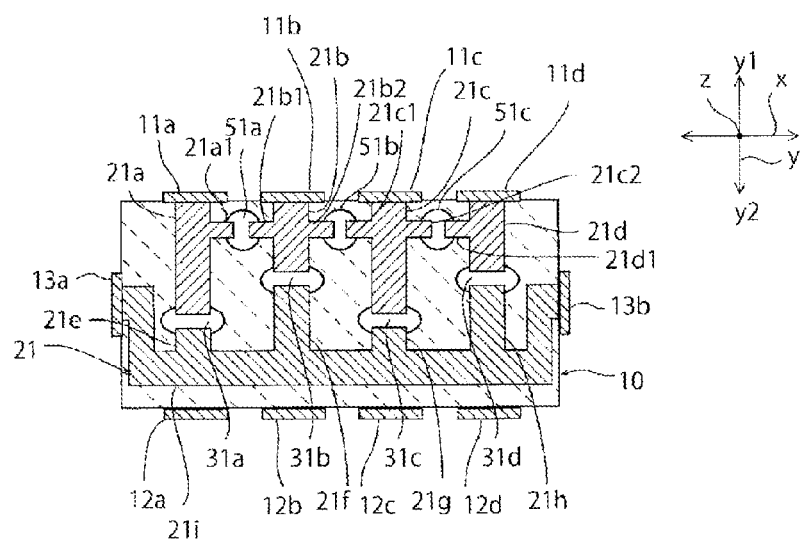
FIG. 10 is a schematic sectional view illustrating an ESD protection device according to a fourth embodiment.

FIG. 10 is a schematic sectional view illustrating an ESD protection device according to a fourth embodiment. As shown in FIG. 10, main discharge units 31a through 31d include main discharge units displaced from each other in the y-axis direction. More specifically, among the main discharge units 31a through 31d, main discharge units disposed adjacent to each other in the x-axis direction are displaced from each other in the y-axis direction. Accordingly, it is less likely that the heat generated by discharge in each of the main discharge units 31a through 31d will be conducted to an adjacent main discharge unit, thereby suppressing the heat degradation of the main discharge units 31a through 31d. Thus, it is possible to implement the higher reliability of the ESD protection device. In this embodiment, secondary discharge units 51a through 51c are disposed linearly in the x-axis direction. However, from the viewpoint of implementing the higher reliability, it is preferable that among the secondary discharge units 51a through 51c, secondary discharge units disposed adjacent to each other in the x-axis direction are displaced from each other in the y-axis direction.

Fifth Embodiment

Figure 11:
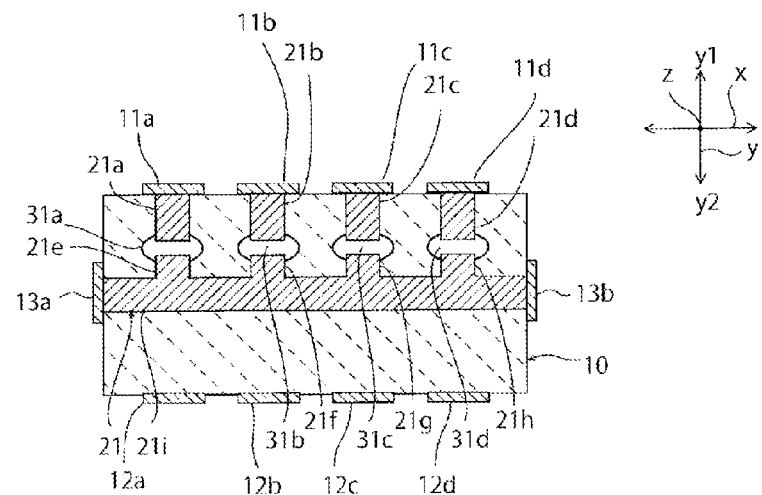
FIG. 11 is a schematic sectional view illustrating an ESD protection device according to a fifth embodiment.
Figure 12:
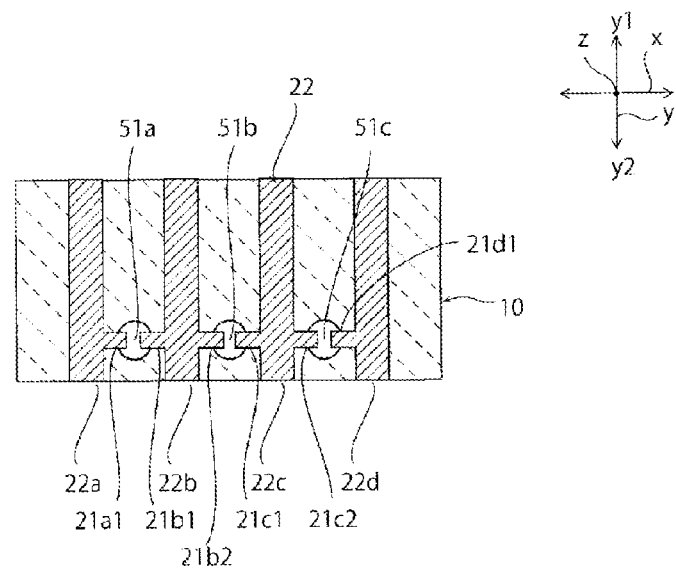
FIG. 12 is a schematic sectional view illustrating the ESD protection device according to the fifth embodiment.

FIGS. 11 and 12 are schematic sectional views illustrating an ESD protection device according to a fifth embodiment. In the ESD protection device according to this embodiment, main discharge units 31a through 31d and secondary discharge units 51a through 51c are disposed on different electrode layers. More specifically, the main discharge units 31a through 31d are disposed on the first electrode layer 21, while the secondary discharge units 51a through 51c are disposed on the second electrode layer 22. With this arrangement, it is less likely that the heat generated by discharge in the main discharge units 31a through 31d will be conducted to the secondary discharge units 51a through 51c. Thus, it is possible to implement the higher reliability of the ESD protection device. Additionally, the main discharge units 31a through 31d are disposed such that they do not overlap the secondary discharge units 51a through 51c along the height of the electrode layers. Thus, it is even less likely that the heat generated by discharge in the main discharge units 31a through 31d will be conducted to the secondary discharge units 51a through 51c.

If cavities 10a are formed for the main discharge units 31a through 31d and for the secondary discharge units 51a through 51c, it means that the cavities 10a formed for the main discharge units 31a through 31d and the cavities 10a formed for the secondary discharge units 51a through 51c are located in the different electrode layers. Thus, it is less likely that the insulating layers on which the electrode layers are formed will be delaminated, compared with a case in which the cavities 10a are formed in the same electrode layer. Additionally, the cavities 10a formed for the main discharge units 31a through 31d are disposed such that they do not overlap the cavities 10a formed for the secondary discharge units 51a through 51c along the height of the electrode layers, thereby making it possible to suppress the deformation of the device body 10 due to the provision of the cavities 10a.

Sixth Embodiment

Figure 13:
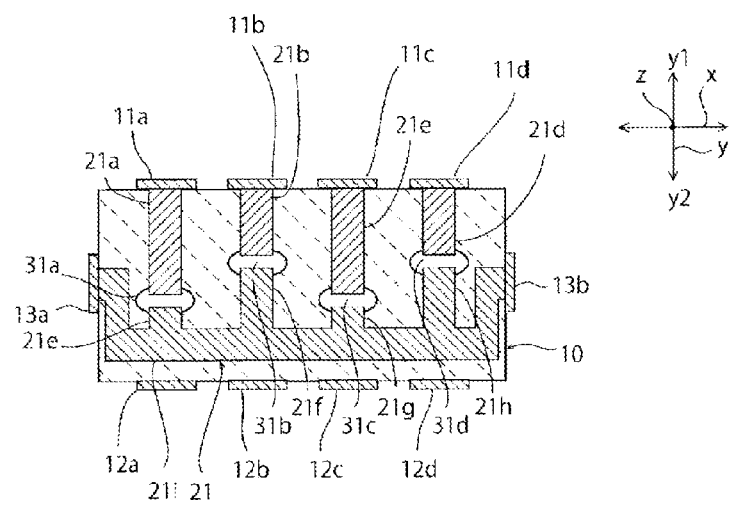
FIG. 13 is a schematic sectional view illustrating an ESD protection device according to a sixth embodiment.
Figure 14:
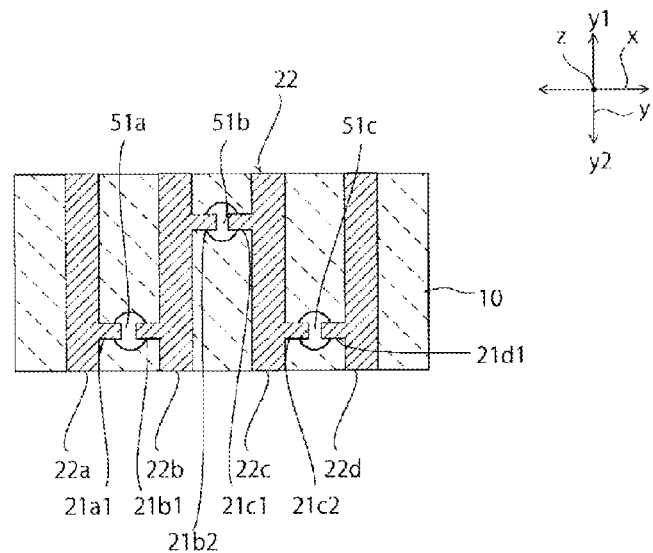
FIG. 14 is a schematic sectional view illustrating the ESD protection device according to the sixth embodiment.

FIGS. 13 and 14 are schematic sectional views illustrating an ESD protection device according to a sixth embodiment. In the ESD protection device according to this embodiment, too, main discharge units 31a through 31d and secondary discharge units 51a through 51c are disposed on different electrode layers. More specifically, the main discharge units 31a through 31d are disposed on the first electrode layer 21, while the secondary discharge units 51a through 51c are disposed on the second electrode layer 22. Moreover, in this embodiment, among the main discharge units 31a through 31d, main discharge units disposed adjacent to each other in the x-axis direction are displaced from each other in the y-axis direction. Among the secondary discharge units 51a through 51c, secondary discharge units disposed adjacent to each other in the x-axis direction are displaced from each other in the y-axis direction. Accordingly, it is less likely that the heat generated by discharge in each of the discharge units will be conducted to the other discharge units. Thus, it is possible to implement the higher reliability of the ESD protection device.

If cavities 10a are formed for the main discharge units 31a through 31d and for the secondary discharge units 51a through 51c, the cavities 10a formed for main discharge units disposed adjacent to each other in the x-axis direction among the main discharge units 31a through 31d are displaced from each other in the y-axis direction, and the cavities 10a formed for secondary discharge units disposed adjacent to each other in the x-axis direction among the secondary discharge units 51a through 51c are displaced from each other in the y-axis direction. Thus, it is less likely that the insulating layers on which the electrode layers are formed will be delaminated, compared with a case in which the cavities 10a are not displaced from each other in the y-axis direction.

1 ESD protection device
10 device body
10a cavity
11a through 11d input terminal
12a through 12d output terminal
13a through 13d ground terminal 21 first electrode layer
21a through 21d input electrode
21a1, 21b1, 21b2, 21c1, 21c2, 21d1 projecting portion
21e through 21h output electrode
21i, 22a through 22d electrode
22 second electrode layer
31a through 31d main discharge unit
41 auxiliary discharge electrode
41a metallic particle
41b semiconductor ceramic particle
42 protective layer
51a through 51c secondary discharge unit

The invention claimed is:

1. An ESD protection device comprising:
a plurality of input electrodes disposed along a first direction; and
a plurality of output electrodes disposed along the first direction and opposed to the input electrodes in a second direction tilted with respect to the first direction, wherein
end portions of the input electrodes on a side closer to the output electrodes in the second direction and end portions of the output electrodes on a side closer to the input electrodes in the second direction constitute main discharge units, and
the plurality of input electrodes include one or more pairs of two input electrodes, wherein each pair of the two input electrodes are disposed adjacent to each other in the first direction and constitute a secondary discharge unit.

2. The ESD protection device according to claim 1, wherein at least one of the two input electrodes includes a projecting portion projecting toward another input electrode and constituting the secondary discharge unit.

3. The ESD protection device according to claim 1, further comprising:
an auxiliary discharge electrode disposed between the two input electrodes so as to reduce a discharge start voltage across the two input electrodes and constituting the secondary discharge unit.

4. The ESD protection device according to claim 1, wherein a discharge start voltage of the secondary discharge unit is higher than a discharge start voltage of the main discharge units.

5. The ESD protection device according to claim 1, wherein:
the plurality of input electrodes include a plurality of pairs of the two input electrodes, wherein each pair of the two input electrodes constitute the secondary discharge unit; and
the plurality of the secondary discharge units include secondary discharge units displaced from each other in the second direction.

6. The ESD protection device according to claim 1, wherein the plurality of the main discharge units include main discharge units displaced from each other in the second direction.

7. The ESD protection device according to claim 1, wherein:
the input electrodes have a plurality of electrode layers including a first electrode layer opposed to the output electrodes; and
the secondary discharge unit is included in an electrode layer other than the first electrode layer.

8. The ESD protection device according to claim 1, wherein the plurality of output electrodes are electrically connected to each other.

9. The ESD protection device according to claim 1, further comprising:
a device body that contains the plurality of input electrodes and the plurality of output electrodes and that is made of an insulating material.

10. The ESD protection device according to claim 9, wherein:
the device body includes a cavity; and
at least one of the main discharge units and the secondary discharge unit is disposed within the cavity.

11. The ESD protection device according to claim 1, further comprising:
an outer electrode that is disposed on the device body and that is connected to the input electrodes or the output electrodes.

12. The ESD protection device according to claim 2, further comprising:
an auxiliary discharge electrode disposed between the two input electrodes so as to reduce a discharge start voltage across the two input electrodes and constituting the secondary discharge unit.

13. The ESD protection device according to claim 2, wherein a discharge start voltage of the secondary discharge unit is higher than a discharge start voltage of the main discharge units.

14. The ESD protection device according to claim 3, wherein a discharge start voltage of the secondary discharge unit is higher than a discharge start voltage of the main discharge units.

15. The ESD protection device according to claim 2, wherein:
the plurality of input electrodes include a plurality of pairs of the two input electrodes, wherein each pair of the two input electrodes constitute the secondary discharge unit; and
the plurality of the secondary discharge units include secondary discharge units displaced from each other in the second direction.

16. The ESD protection device according to claim 3, wherein:
the plurality of input electrodes include a plurality of pairs of the two input electrodes, wherein each pair of the two input electrodes constitute the secondary discharge unit; and
the plurality of the secondary discharge units include secondary discharge units displaced from each other in the second direction.

17. The ESD protection device according to claim 4, wherein:
the plurality of input electrodes include a plurality of pairs of the two input electrodes, wherein each pair of the two input electrodes constitute the secondary discharge unit; and
the plurality of the secondary discharge units include secondary discharge units displaced from each other in the second direction.

18. The ESD protection device according to claim 2, wherein the plurality of the main discharge units include main discharge units displaced from each other in the second direction.

19. The ESD protection device according to claim 3, wherein the plurality of the main discharge units include main discharge units displaced from each other in the second direction.

20. The ESD protection device according to claim 4, wherein the plurality of the main discharge units include main discharge units displaced from each other in the second direction.

* * * * *